US008429430B2

(12) United States Patent
Koike

(10) Patent No.: US 8,429,430 B2
(45) Date of Patent: Apr. 23, 2013

(54) INFORMATION PROCESSOR, COMPUTER READABLE RECORDING MEDIUM WHICH RECORDS DATA EVACUATION PROGRAM, AND DATA EVACUATION METHOD

(75) Inventor: Nobuyuki Koike, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 659 days.

(21) Appl. No.: 12/366,992

(22) Filed: Feb. 6, 2009

(65) Prior Publication Data

US 2009/0240961 A1    Sep. 24, 2009

(30) Foreign Application Priority Data

Mar. 21, 2008  (JP) ................................ 2008-073026

(51) Int. Cl.
*G06F 1/00*    (2006.01)
(52) U.S. Cl.
USPC .......................................... 713/300; 713/340
(58) Field of Classification Search ........... 713/300–344
See application file for complete search history.

(56) References Cited

U.S. PATENT DOCUMENTS 5,845,142 A * 12/1998 Hayasaka ...................... 713/340
6,522,361 B2 *  2/2003 Higuchi et al. ............... 348/372

FOREIGN PATENT DOCUMENTS

| JP | 01-287722 | | 11/1989 |
|----|-----------|---|---------|
| JP | 6-12154 | | 1/1994 |
| JP | 9-330277 | * | 12/1997 |
| JP | 2001-282400 | | 10/2001 |
| JP | 2002-229688 | * | 8/2002 |
| JP | 2006-119916 | | 5/2006 |
| JP | 2006-350481 | * | 12/2006 |

OTHER PUBLICATIONS

Office Action issued by the Japanese Patent Office on Dec. 27, 2011 in the corresponding Japanese patent application No. 2008-073026.
Japanese Patent Office Notification of Reasons for Refusal mailed Aug. 7, 2012 for corresponding Japanese Patent Application No. 2008-073026.

* cited by examiner

*Primary Examiner* — Brian Misiura
*Assistant Examiner* — Kim Huynh
(74) *Attorney, Agent, or Firm* — Staas & Halsey LLP

(57) ABSTRACT

An information processor includes a set information storage unit storing evacuation residual quantity information representing an evacuation residual quantity as a residual quantity of the battery that corresponds to electric power necessary for executing a data evacuation process for storing data, stored in a memory of the information processor, onto a nonvolatile recording medium, a battery residual quantity detecting unit detecting the battery residual quantity of the battery, a load information collecting unit acquiring load information representing an electric load of the information processor, an evacuation residual quantity setting unit setting the evacuation residual quantity based on the load information collected by the load information collecting unit, and controls the set information storage unit to store the evacuation residual quantity information representing the set evacuation residual quantity, and an evacuation control unit controlling execution of the data evacuation process.

7 Claims, 10 Drawing Sheets

FIG. 5

| CONFIGURATION PATTERN | TIME | BATTERY RESIDUAL QUANTITY |
|---|---|---|
| CONFIGURATION PATTERN 1 | START OF EVACUATION | 7.3% |
| | COMPLETION OF EVACUATION | 3.1% |

| CONFIGURATION PATTERN | LAST TIME | LAST SECOND TIME | LAST THIRD TIME | AVERAGE VALUE |
|---|---|---|---|---|
| CONFIGURATION PATTERN 1 | 3.9% | 4.2% | 4.4% | 4.2% |
| CONFIGURATION PATTERN 2 | 3.5% | 4.1% | 4.6% | 4.1% |
| ... | ... | | | |

122a

INFORMATION PROCESSOR, COMPUTER READABLE RECORDING MEDIUM WHICH RECORDS DATA EVACUATION PROGRAM, AND DATA EVACUATION METHOD

CROSS-REFERENCE TO RELATED APPLICATION(S)

This application is related to and claims priority to Japanese patent application no. 2008-73026 filed on Mar. 21, 2008 in the Japan Patent Office, and incorporated by reference herein.

BACKGROUND

1. Field of the Invention

The present technique relates to an information processor, a computer readable recording medium that records a data evacuation program, and a data evacuation method, and more particularly, to an information processor that evacuates data stored in a memory in accordance with a reduction of a battery residual quantity, a computer readable recording medium that records a data evacuation program and a data evacuation method.

2. Description of the Related Art

To protect data stored in a memory when a battery residual quantity is very small due to usage, some information processors (such as notebook computers that are driven by a battery) write the data on a nonvolatile recording medium, such as an HDD (Hard Disk Drive), thereby evacuating the data.

In this respect, there is known a technique for recording consumption power in each job function in a normal operation of the information processor, and for controlling the operation in accordance with a residual quantity of the battery when the battery residual quantity is very small.

There is known a technique for recording consumption power when the processor is in operation, and for measuring the capacity of a battery in accordance with its actual usage by causing load thereon based on the recorded data.

A question here is asked, "How much the battery residual quantity remains when data is evacuated in HDD?" Because some electric power is necessary while executing this data evacuation, the battery runs out before its completion if the battery residual quantity is too small, thus losing the data stored in the memory.

Up to this time, typically, some setting is given, (for example, "data evacuation is performed when a battery residual quantity is 5 percent") with some appropriate margin given to the battery residual quantity.

However, this "electric power necessary for the evacuation operation in HDD" (i.e. "the battery residual quantity taken as a chance for data evacuation") may differ between the types or individuals of the processors. With regard to this, in the past, the residual quantity with an expected margin is determined so as to be set, by measuring consumption power in the above-described process of the configuration at the time of shipment.

The information processor will have only a short processing time, thus will not easily be used. This is because, if a too large margin is given to the residual quantity of the battery for executing the data evacuation in great consideration of the safety, the data evacuation is performed at a very fast timing.

According to the conventional art, the actually consumed electric power is measured, and the operation of the information processor is controlled based on the measured information. A problem here is that it is necessary to provide a large margin for the battery residual quantity when starting the evacuation, in order to safely evacuate data, because of low accuracy in directly knowing the actual battery residual quantity.

According to the conventional art, the battery residual quantity is simply displayed; thereby the user himself/herself needs to adjust the battery residual quantity depending on the load. A problem is that it requires skillful technique for improving the accuracy in order to safely evacuate the data.

The present technique has been made in consideration of the above. It is accordingly an object thereof to provide an information processor that can safely evacuate data and maintaining a long working time of the information processor, a computer readable recording medium recording a data evacuation program and a data evacuation method.

SUMMARY

An information processor that is driven by a battery includes a set information storage unit storing evacuation residual quantity information representing an evacuation residual quantity as a residual quantity of the battery that corresponds to electric power necessary for executing a data evacuation process for storing data, stored in a memory of the information processor, onto a nonvolatile recording medium, a battery residual quantity detecting unit detecting the battery residual quantity of the battery, a load information collecting unit acquiring load information representing an electric load of the information processor, an evacuation residual quantity setting unit setting the evacuation residual quantity based on the load information collected by the load information collecting unit, and controlling the set information storage unit to store the evacuation residual quantity information representing the set evacuation residual quantity, and an evacuation control unit controlling execution of the data evacuation process based on the battery residual quantity detected by the battery residual quantity detecting unit and the evacuation residual quantity information stored in the set information storage unit.

BRIEF DESCRIPTION OF THE DRAWINGS

FIG. 5 is a diagram showing an example of a data configuration of an evacuation-time residual quantity table;

FIG. 6 is a diagram showing an example of a data configuration of an evacuation usage quantity table;

DETAILED DESCRIPTION OF THE EMBODIMENTS

Figure 1:
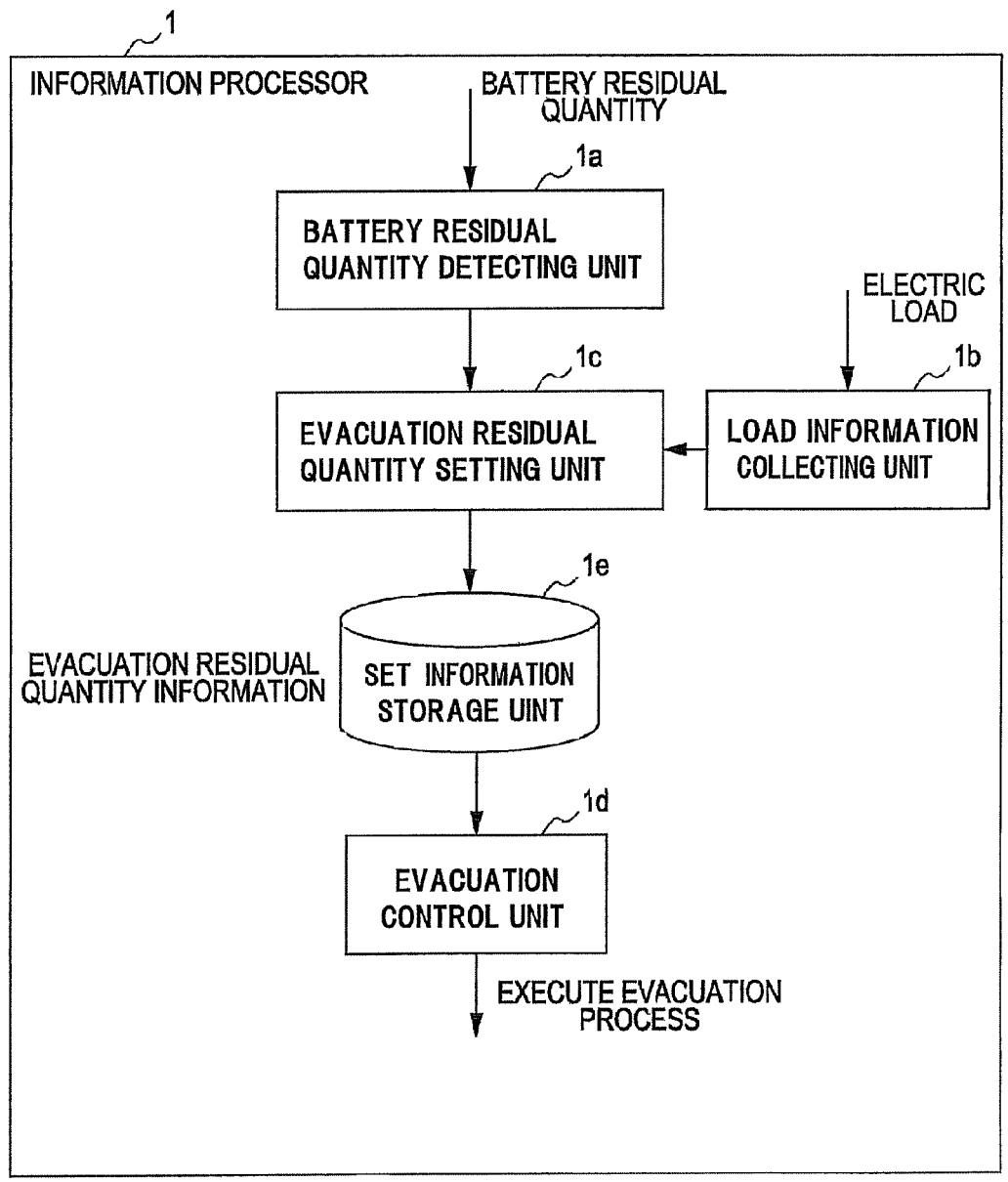
FIG. 1 is a diagram showing the scheme of an embodiment.

FIG. 1 is a diagram showing the scheme of this embodiment. An information processor 1 shown in FIG. 1 is driven by a battery (as will be described later in FIG. 4), such as a rechargeable battery or the like, and stores data in a memory included in the information processor 1.

The information processor 1 has a battery residual quantity detecting means 1a, a load information collecting means 1b, an evacuation residual quantity setting means 1c, an evacuation control means 1d, and set information storage means 1e.

The battery residual quantity detecting means 1a detects a battery residual quantity representing a residual quantity of a battery. The battery residual quantity detecting means 1a detects the residual quantity of the battery always or at a given interval, when the information processor 1 is in a normal operation.

The load information collecting means 1b acquires load information representing an electric load of the information processor 1. This electric load indicates the entire electric load of the information processor 1, and indicates also the entire load of a device receiving a power supply from the information processor 1, of internal devices included in the information processor 1, and of external devices connected to the information processor 1.

The evacuation residual quantity setting means 1c sets an evacuation residual quantity based on the load information collected by the load information collecting means 1b. Then, the evacuation residual quantity setting means 1c stores the evacuation residual quantity information representing the set evacuation residual quantity in the set information storage means 1e.

The evacuation control means 1d executes a data evacuation process, when a small quantity of battery remains, based on the latest residual quantity of battery which is detected by the battery residual quantity detecting means 1a and the evacuation residual quantity information stored in the set information storage means 1e.

The set information storage means 1e stores the evacuation residual quantity information representing the evacuation residual quantity that is a battery residual quantity corresponding to electric power necessary for executing a data evacuation process, for storing data stored in a memory of the information processor 1 in a recording medium, such as a nonvolatile HDD, etc. This recording medium may be provided inside or outside the information processor 1.

As described above, in the information processor 1, the evacuation control means 1d executes the data evacuation process based on the latest battery residual quantity and the evacuation residual quantity which has been set based on the load information, thereby measuring and recording the consumption power in an actual operation of the information processor 1 in advance. This results in a small residual quantity of the battery remaining, and that remainder of the battery can be very small when evacuating the data stored in the memory of the information processor 1. As a result, when a small residual quantity of battery remains, the data stored in the memory can safely be evacuated and a long working time of the information processor can be attained.

Explanations will now specifically be made to this embodiment with reference to the drawings.

Figure 2:
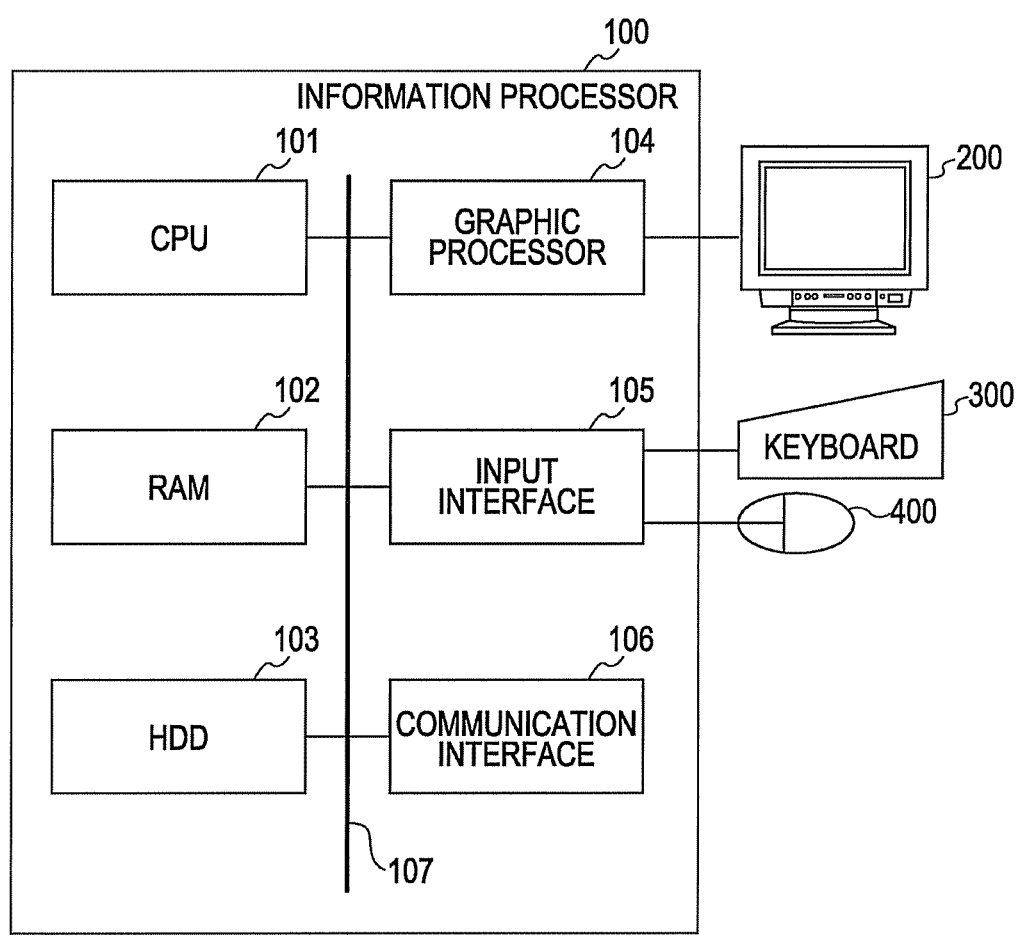
FIG. 2 is a hardware configuration diagram of an information processor.

FIG. 2 is a hardware configuration diagram of the information processor.

An information processor 100 is entirely controlled by a CPU (Central Processing Unit) 101. The CPU 101 is connected to a RAM (Random Access Memory) 102, an HDD 103, a graphic processor 104, an input interface 105 and a communication interface 106, through a bus 107.

The RAM 102 temporarily stores at least a part of an OS (Operating System) program or application executed by the CPU 101. The RAM 102 stores various data necessary for those processes executed by the CPU 101.

The HDD 103 stores data to be handled by the OS or application on the information processor 100.

The HDD 103 temporarily stores data that is evacuated from the RAM 102 by an evacuation process.

The graphic processor 104 is connected to a monitor 200. The graphic processor 104 displays an image on the display screen of the monitor 200 in accordance with an instruction from the CPU 101. The graphic processor 104 and the monitor 200 are connected with each other through a serial communication cable, and send and receive alternately, for example, a control signal and an image signal.

The input interface 105 is connected to a keyboard 300 and a mouse 400. The input interface 105 outputs a signal sent from the keyboard 300 and the mouse 400 to the CPU 101 through the bus 107.

The communication interface 106 is connectable to a network (not shown). The communication interface 106 can send and receive data to and from other computers through the network.

The processing functions of this embodiment can be realized with the above-described hardware configuration.

Explanations will now be made to a module configuration of the information processor 100.

Figure 3:
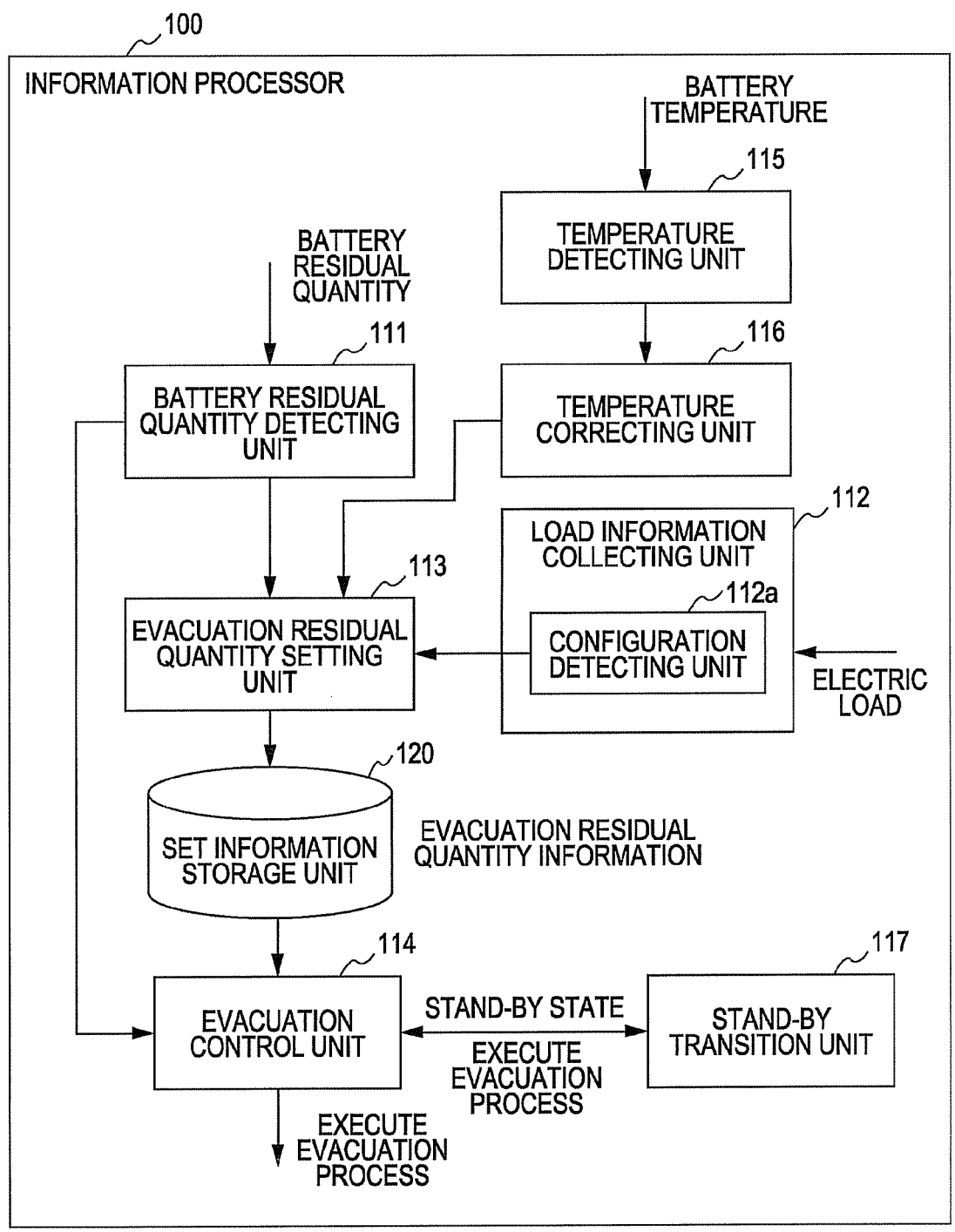
FIG. 3 is a block diagram showing functions of the information processor.

FIG. 3 is a block diagram showing functions of the information processor.

The information processor 100 of this embodiment is a portable computer (e.g. a notebook computer) that can be driven by a rechargeable battery and a commercial power and that stores data in the memory of the information processor 100. When the battery residual quantity is reduced in the information processor 100, data is evacuated by writing it on the HDD 103 (see FIG. 2), a nonvolatile recording medium, in order to protect the data recorded in the memory.

The information processor 100 has a battery residual quantity detecting unit 111, a load information collecting unit 112, an evacuation residual quantity setting unit 113, an evacuation control unit 114, and a temperature detecting unit 115, a temperature correcting unit 116, a stand-by transition unit 117 and a set information storage unit 120. The load information collecting unit 112 has a configuration detecting unit 112a.

The battery residual quantity detecting unit 111 detects a battery residual quantity that represents the residual quantity of the battery. The battery residual quantity detecting unit 111 detects the residual quantity of the battery always or at a given interval, when the information processor 100 is in normal operation. The battery residual quantity detecting unit 111 detects the battery residual quantity representing the residual quantity of the battery, even when the information processor 100 is in a stand-by state (or a Suspend to Memory state) for restricting a part of the operation thereof while keeping data in the RAM 102 for the sake of energy saving. As a result, even when the battery residual quantity is reduced in a stand-by state, the data stored in the RAM 102 can be evacuated.

The load information collecting unit 112 acquires load information representing an electric load of the information processor 100. This electric load indicates the entire electric load of the information processor 100, and indicates the entire load of a device(s) receiving a power supply from the information processor 100, of internal devices included in the information processor 100 and external devices connected to the information processor 100 and so on.

The configuration detecting unit 112a detects a configuration of a device that is an electric load of the information processor 100. The electric load represented in the above-described load information includes configuration information representing a configuration of the device detected by the configuration detecting unit 112*a*. The configuration detecting unit 112*a* detects a change in the device configuration using the Plug and Play function.

The evacuation residual quantity setting unit 113 stores difference information representing a plurality of differences in time series, in the set information storage unit 120. The evacuation residual quantity setting unit 113 sets new evacuation residual quantity information based on past difference information. Specifically, the evacuation residual quantity setting unit 113 sets evacuation residual quantity information, based on a difference between a battery residual quantity that has been detected by the battery residual quantity detecting unit 111 at the completion of the data evacuation process and a battery residual quantity that has been detected by the battery residual quantity detecting unit 111 at the beginning of the data evacuation process. Now, the evacuation residual quantity that has been set by the evacuation residual quantity setting unit 113 is corrected by the temperature correcting unit 116. The evacuation residual quantity setting unit 113 stores the evacuation residual quantity information representing the evacuation residual quantity that has been corrected by the temperature correcting unit 116, in the set information storage unit 120.

The evacuation residual quantity setting unit 113 sets an evacuation residual quantity similarly in accordance with the change in the device configuration, when the device configuration detected by the configuration detecting unit 112*a* and represented in the configuration information is changed, and stores evacuation residual quantity information representing the set evacuation residual quantity in the set information storage unit 120.

The evacuation control unit 114 controls execution of a data evacuation process, when the residual quantity of the battery is very small, based on the latest battery residual quantity detected by the battery residual quantity detecting unit 111 and the evacuation residual quantity information stored in the set information storage unit 120, in accordance with the device configuration represented in the configuration information. For example, the evacuation control unit 114 executes a data evacuation process, when the battery residual quantity detected by the battery residual quantity detecting unit 111 is equal to or lower than an evacuation residual quantity set by the evacuation residual quantity setting unit 113. Plural kinds of evacuation residual quantity information exist in accordance with the kind of the device configuration. This evacuation residual quantity information will more specifically be described later based on FIG. 5 and FIG. 6.

The evacuation control unit 114 controls execution of the data evacuation process even in a stand-by state transited by the stand-by transition unit 117.

The temperature detecting unit 115 detects the temperature of the battery. In general, the higher the temperature of the battery, the better the discharge characteristics. The lower the temperature of the battery, the worse the discharge characteristics. To enhance the measurement accuracy of the residual quantity, it is necessary to correct the evacuation residual quantity in accordance with the temperature of the battery on the basis of the above-described principle.

The temperature correcting unit 116 corrects the evacuation residual quantity information representing the evacuation residual quantity set by the evacuation residual quantity setting unit 113 based on the temperature of the battery which has been detected by the temperature detecting unit 115. As a result, the change in the battery characteristics in accordance with the temperature variation of the battery is reflected in the evacuation residual quantity, thus enhancing the accuracy of determination for starting the execution of the data evacuation.

The stand-by transition unit 117 transits the information processor 100 into a stand-by state for stopping a part of operations of the information processor 100 while keeping the data in the memory, at the satisfaction of a predetermined condition (e.g. the battery residual quantity is equal to or lower than a predetermined value which is set for transiting into a stand-by state), for example, when the information processor 100 has not operated for a given period of time that is set for the sake of energy saving.

The set information storage unit 120 stores evacuation residual quantity information representing a evacuation residual quantity that is a battery residual quantity corresponding to electric power necessary for executing the data evacuation process for storing the data stored in the memory of the information processor 100 on a recording medium, such as nonvolatile HDD, etc. In this embodiment, the HDD 103 included in the information processor 100 is used as this recording medium.

Now, explanations will be made to data evacuation to be executed by the information processor 100 in this embodiment. The following six levels are defined for conditions in consumption power in a PC, according to an ACPI (Advanced Configuration and Power Interface) as a standard regarding power control of PCs (Personal Computers).

S0: Operation State
S1: Quick Stand-by State
S2: (Unused)
S3: Stand-by State (interrupt the operation while keeping data in the memory)
S4: Hibernation State (evacuates data in the hard disk and interrupts the operation)
S5: Shutdown State In this embodiment, the evacuation residual quantity is calculated in order to determine the timing for starting the data evacuation that is executed in the transition to the above-described condition S4.

In this S4, the power consumption can be 0 or near 0. In addition, even an accident occurs until restart of processing, returning can be tried again, unless the data evacuated in the HDD is deleted.

In S3, for example, because document data in its preparation exists basically only in the memory, the document will be lost if the operation of the information processor stops as a result the battery running out.

Now, assume a case where S3 and S4 are combined together. At the transition to S3, if the battery residual quantity further decreases, it returns once to S0 and transits to S4 (needs to transit to S0 once, because the operation of the HDD is necessary for transition to S4).

According to one method, at the transition to S3, the data is evacuated in the HDD at the same time, and returning from S3 is abandoned so as to switch to return from S4, when the battery residual quantity further decreases (when the battery residual quantity runs out during the stand-by state of S3, and returning from S3 has failed, the returning from S4 may be done).

The operation for evacuating the data consumes some time and some electric power quantity. Thus, if the battery residual quantity is too small at the point of starting the evacuation operation, the battery runs out before completion of the operation, thus losing the data.

The ACPI includes a power management function, and refers to "whether sufficient electric power can be supplied to each device under consideration of the capacity of the system power source". No examination is made as to "the power quantity at the time of data evacuation" like this embodiment.

In this embodiment, the electric power quantity necessary for evacuating the data in the HDD is calculated based on an actual evacuation result, thereby preventing running out of battery in the transition to S4 and securely evacuating data, and also enabling to have a long working time of the information processor 100.

In the information processor 100 of this embodiment, the electric power quantity to be consumed in the data evacuation at the transition is recorded, and further, the consumed electric power quantity is computed, when an S4 transition is done upon decrease in the battery residual quantity, upon user operation of an instruction for suspension, or upon setting of energy saving (when no operation is performed for a predetermined period of time).

For this purpose, a battery residual quantity recorder 130r (see FIG. 4) records a battery residual quantity at the beginning of the S4 transition and its completion time. An application 130u reads out the record at the time of returning (S0 transition), and calculates the quantity of the used electric power.

Notebook computers measure the battery residual quantity. For example, when the quantity is measured by a microcomputer installed in a battery pack, the microcomputer may include a means for informing the microcomputer about the start time of data evacuation and its completion time, a means for calculating and recording a difference of electric power quantities there between, and a means for reading out the record. The notebook computer may have the same microcomputer provided on its body so as to measure the battery residual quantity. Even in this case, the same method is adopted for realizing the measurement. The "means of the system for informing about the completion time of the S4 transition (or data evacuation)" may be replaced with a "means of the microcomputer for detecting the completion time of the S4 transition (or data evacuation)". In this manner, the information processor 100 may detect the most recent S4 transition (or data evacuation).

Explanations will now be made to operations of the information processor 100 of this embodiment.

Figure 4:
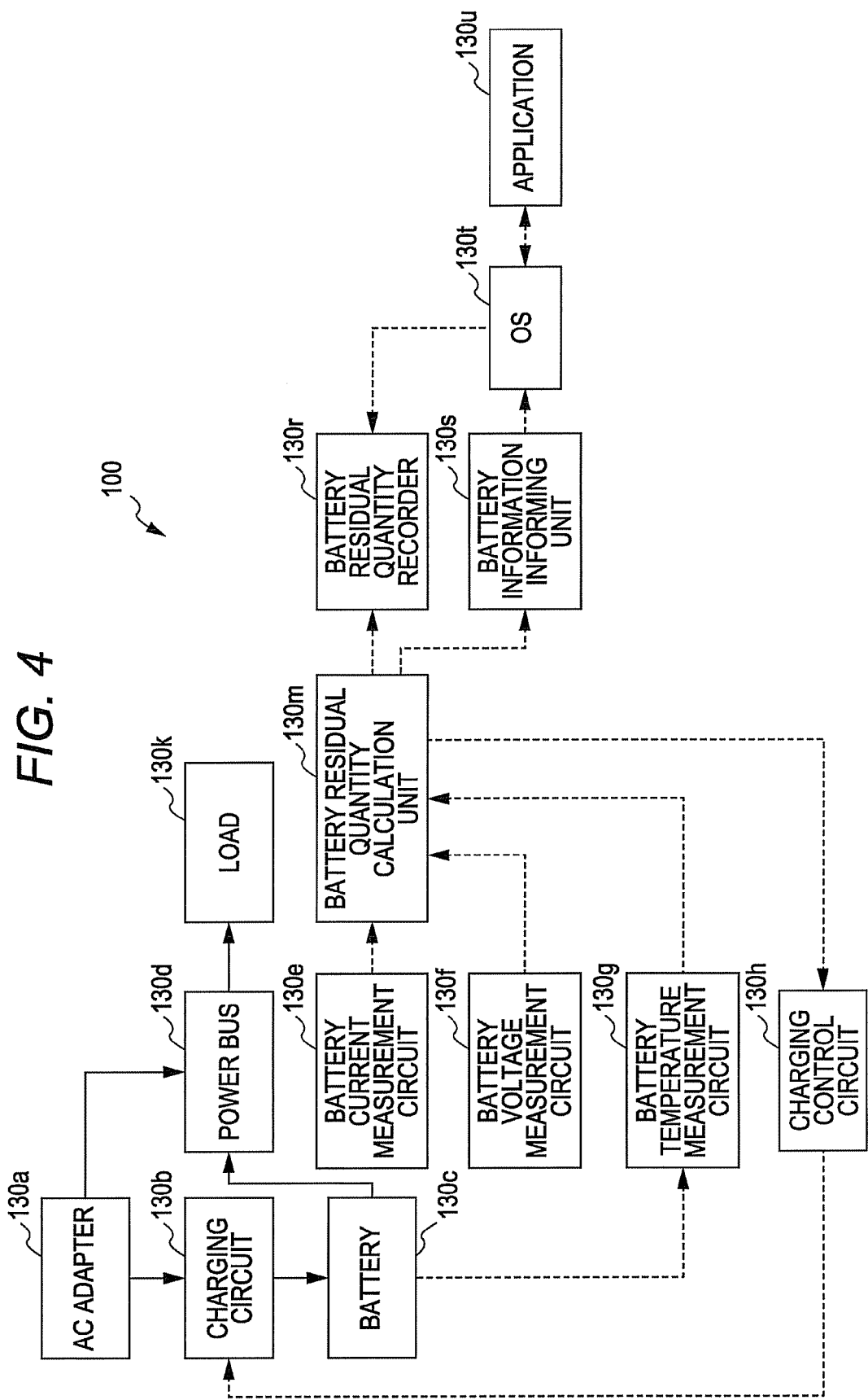
FIG. 4 is a diagram showing operations of the information processor.

FIG. 4 is a diagram showing operations of the information processor. The information processor 100 of this embodiment is driven by operations of: an AC adapter 130a; a charging circuit 130b; a battery 130c; a power bus 130d; a buttery current measurement circuit 130e, a battery voltage measurement circuit 130f; a battery temperature measurement circuit 130g; a charging control unit 130h; a load 130k; a battery residual quantity calculation unit 130m; a battery residual quantity recorder 130r; a battery information informing unit 130s; an OS 130t and the application 130u. Further, the information processor 100 executes data evacuation by their operations. Solid arrows indicate the flow of electric power, while dotted arrows indicate information or instructions.

For example, the AC adapter 130a converts the commercial power of 100V and supplies the information processor 100 with electric power. The information processor 100 operates by the electric power supplied from the AC adapter 130a.

The charging circuit 130b charges the battery 130c using the AC adapter 130a as a power source, under the control of the charging control unit 130h.

The battery 130c is a secondary battery (storage battery) and is a repeatedly usable battery having electricity as a result of being charged. A lithium-ion battery, which is used for the information processor (including notebook computers and the like), may be used as the battery 130c. The battery is not limited to the battery 130c and any other secondary batteries may be used.

The power bus 130d supplies the information processor 100 with electric power supplied from the AC adapter 130a and the battery 130c, and controls this supply.

Various measurement circuits as descried below are provided around the battery 130c. The residual quantity of the battery 130c is calculated based on the measurement values. When the residual quantity is very small, and when the electric power is supplied from the AC adapter 130a, the battery 130c is charged.

The battery current measurement circuit 130e measures the size of a current supplied for charging the battery 130c and the size of a current supplied from the battery 130c to the information processor 100, and informs the battery residual quantity calculation unit 130m of the measurement results.

The battery voltage measurement circuit 130f measures the size of a voltage supplied for charging the battery 130c and the size of a voltage supplied from the battery 130c to the information processor 100, and informs the battery residual quantity calculation unit 130m of the measurement results.

The above-described battery current measurement circuit 130e and the battery voltage measurement circuit 130f function as the battery residual quantity detecting unit 111. In this embodiment, the residual quantity of the battery 130c is measured by the above-described battery current measurement circuit 130e and the battery voltage measurement circuit 130f. However, this embodiment is not limited to this, and either one of them may be used for measuring the residual quantity of the battery 130c.

The battery temperature measurement circuit 130g measures the temperature of the battery 130c, and informs the battery residual quantity calculation unit 130m of the measurement result. As described above, generally, the higher the temperature of the battery, the better the discharge characteristics. The lower the temperature of the battery, the worse the discharge characteristics. To enhance the measurement accuracy of the residual quantity, it is necessary to correct the evacuation residual quantity in accordance with the temperature of the battery. In this embodiment, the calculation result of the battery residual quantity at the charge/discharge is corrected in accordance with the temperature of the battery 130c that is measured by this battery temperature measurement circuit 130g. As a result, the residual quantity of the battery 130c can be calculated more correctly. This battery temperature measurement circuit 130g functions as the temperature detecting unit 115.

The charging control unit 130h controls charging of the battery 130c with the charging circuit 130b based on the calculation result by the battery residual quantity calculation unit 130m.

The load 130k is an electric load by a device receiving electric power supplied by the information processor 100 and is connected to the entire of the information processor 100 and the information processor 100. This device receiving the electric power supplied by the information processor 100 includes, for example, a mouse, a keyboard, a USB (registered trademark) hub, an external speaker, and the like.

The battery residual quantity calculation unit 130m calculates the residual quantity of the battery 130c based on the measurement results of the battery current measurement circuit 130e, the battery voltage measurement circuit 130f and the battery temperature measurement circuit 130g.

The battery residual quantity recorder 130r records the result of calculating the residual quantity of the battery 130c which is obtained by the battery residual quantity calculation unit 130m, in response to an instruction of the OS 130t. Based on this, the information processor 100 of this embodiment records the residual quantity of the battery 130c both at the start time of data evacuation and its completion time. Next, based on the recorded residual quantity, the evacuation residual quantity (see FIG. 3) is calculated.

The battery information informing unit 130s informs the OS 130t of the information processor 100 about the calculation result of the residual quantity of the battery 130c that is obtained by the battery residual quantity calculation unit 130m.

The OS 130t is an OS operating on the information processor 100. The OS 130t informs the application 130u of the power quantity of the battery 130c that is the calculation result obtained by the battery residual quantity calculation unit 130m. In this manner, the OS 130t, having a power management function, monitors the residual quantity of the battery 130c. The OS 130t records the residual quantity of the battery 130c at the start time of data evacuation and its completion time, in the battery residual quantity recorder 130r.

In this embodiment, the application 130u is an application software for controlling the evacuation of data recorded in the RAM 102 based on a reduction in the residual quantity of the battery 130c, and operates under the OS 130t. In this manner, the application 130u adds a function for recording the residual quantity of the battery 130c at the point of time. The OS 130t can read out the residual quantity of the battery 130c as a part of battery information. Further, the application 130u can read out this battery information through the OS 130t. The application 130u may include a single program, or may include a plurality of programs.

In the information processor 100 of this embodiment, the OS 130t detects the reduction of the residual quantity of the battery 130c, and determines data evacuation (transition to S4). Then, the OS 130t informs a power management application (not shown) executing data evacuation and the application 130u about execution of data evacuation in the RAM 102. If the power management application receives this information, it executes data evacuation.

Based on this information, the application 130u records the residual quantity of the battery 130c at the timing of this information. As a result, the information processor 100 can record the residual quantity of the battery 130c at the start time of the data evacuation.

Further, the information processor 100 assumes the timing in which the electric power used by the information processor 100 is remarkably reduced, as a completion time of data evacuation. Then, the processor records the residual quantity of the battery 130c at this time. In this case, as described above, the battery residual quantity calculation unit 130m calculates the residual quantity of the battery 130c, based on measurement results of the battery current measurement circuit 130e, the battery voltage measurement circuit 130f and the battery temperature measurement circuit 130g.

For the sake of accuracy, the processor 100 may assume the "power-off" timing as the completion timing of data evacuation, while monitoring a signal for controlling the power bus 130d or the like. Alternatively, the OS 130t and a power source management application may directly instruct for the completion timing.

As described above, the information processor 100 of this embodiment measures an electric power quantity actually required for one data evacuation. The measured electric power quantity actually required for data evacuation is acquired by the application 130u.

Explanations will now be made to a table used in the information processor 100 of this embodiment. FIG. 5 is a diagram showing an example of a data configuration of an evacuation-time residual quantity table. FIG. 6 is a diagram showing an example of a data configuration of an evacuation usage quantity table.

An evacuation-time residual quantity table 121a shown in FIG. 5 is created and managed by the information processor 100. The evacuation-time residual quantity table 121a is a table for recording the residual quantity of the battery 130c before and after data evacuation (see FIG. 4). This evacuation-time residual quantity table 121a is stored in the set information storage unit 120.

The evacuation-time residual quantity table 121a includes data items of "configuration pattern", "time" and "battery residual quantity". Information items are provided in a horizontal direction of the data items in association with each other, thereby forming evacuation-time residual quantity information. This evacuation-time residual quantity information is generated at the start time of the data evacuation. The residual quantity of the battery 130c at the start time of data evacuation is included and recorded in the evacuation-time residual quantity information. The residual quantity of the battery 130c at the completion time of data evacuation is included and recorded in the evacuation-time residual quantity information at the completion time of the data evacuation.

The item "configuration pattern" indicates a term that is assigned for distinguishing combinations of an internal configuration of the information processor 100 and a configuration of a device or devices, connected to the information processor 100 and receiving electric power supplied therefrom, at the start time and completion time of data evacuation. Based on this configuration pattern, the electric load of the information processor 100 at the point of time is set. That is, at the time of the same configuration pattern, the electric load for the battery 130c is the same.

The item "Time" indicates a division of either the start time or completion time of data evacuation, concerning the recorded battery residual quantity.

The item "Battery residual quantity" indicates the residual quantity of the battery 130c at the start time or completion time of data evacuation, based on the indicated information of "Time". The residual quantity of the battery 130c is indicated with "%" (percent). The indication is not limited to this, and it can be indicated with "mAh" (milli-ampere-hour).

The information processor 100 of this embodiment calculates the battery residual quantity actually required for data evacuation, based on the difference between the residual quantities of the battery 130c at the start time and completion time of data evacuation. The residual quantities are included and recorded in the evacuation-time residual quantity information.

The evacuation usage quantity table 122a shown in FIG. 6 is created and managed by the information processor 100. The evacuation usage quantity table 122a is a table for recording the residual quantity of the battery 130c (see FIG. 4) used at the time of data evacuation. This residual quantity is calculated based on the difference between the residual quantities of the battery 130c at the start time and completion time of data evacuation. The residual quantities are included and recorded in the evacuation-time residual quantity information. This evacuation usage quantity table 122a is stored in the set information storage unit 120.

The evacuation usage quantity table 122a includes data items of "Configuration Pattern", "Last Time", "Last Second Time", "Last Third Time" and "Average Value". Information items are provided in a horizontal direction of the data items in association with each other, thereby forming evacuation usage quantity information. This evacuation usage quantity information includes the residual quantities of the battery 130c (for the last few times, e.g. last three times) used in the data evacuation and which are calculated based on the evacuation-time residual quantity information recorded therein.

The data item "configuration pattern" indicates a term that is assigned for distinguishing combinations of an internal configuration of the information processor 100 and a configuration of a device(s), connected to the information processor 100 and receiving electric power supplied there from, at the start time and completion time of data evacuation.

The data item "Last Time" indicates the residual quantity of the battery 130c used for the latest data evacuation. The data item "Last Second Time" indicates the residual quantity of the battery 130c used for data evacuation that has been performed before the data evacuation corresponding to "Last Time". The data item "Last Third Time" indicates the residual quantity of the battery 130c used for data evacuation that has been performed further before the data evacuation corresponding to "Last Second Time".

The data item "Average Value" indicates an average value of the residual quantities of the battery 130c used for the past data evacuations that are recorded in the data items corresponding to "Last Time", "Last Second Time" and "Last Third Time".

In the information processor 100 of this embodiment, the average value of a corresponding configuration pattern is read out at the time of each configuration pattern, based on the evacuation usage quantity information. The read out average value is used as a criterion for determining as to whether data evacuation is performed.

In this embodiment, the determination for data evacuation is made based on, as a criterion, the average value of the battery residual quantities at the recorded data evacuations for the past previous times. The criterion is not limited to this, and the determination can be made based on the latest battery residual quantity at the past data evacuation. A predetermined margin may be provided for the average value or the latest value. If only a small number of sample values for the average value are provided, a large margin may be given for the average value. On the other hand, a large number of sample values for the average value are provided, only a small margin may be given.

Explanations will now be made to a procedure for a process in the information processor of this embodiment. Explanations will be made to a battery residual quantity recording process for recording the residual quantity of the battery 130c before and after data evacuation.

Figure 7:
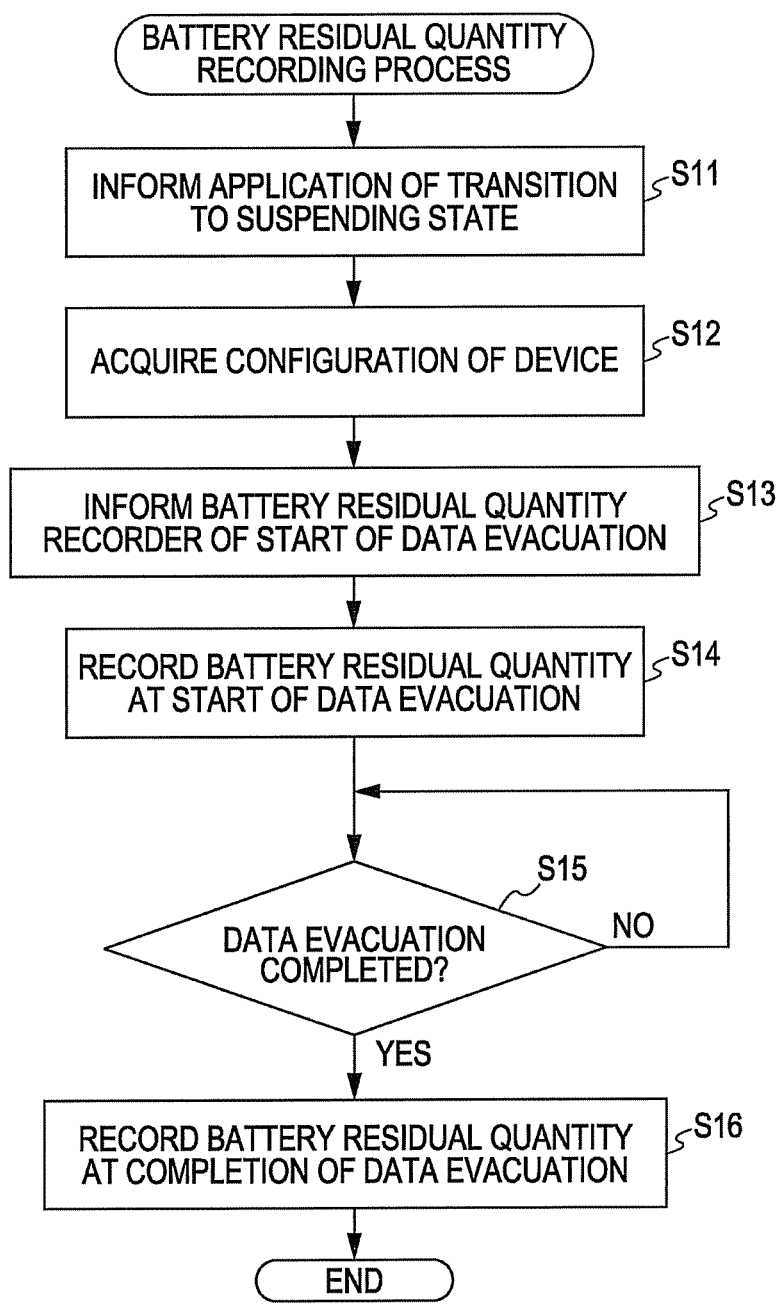
FIG. 7 is a flowchart showing a procedure in a process for recording a battery residual quantity.

FIG. 7 is a flowchart showing a procedure of a battery residual quantity recording process.

As a result of this battery residual quantity recording process, the information processor 100 of this embodiment acquires the battery residual quantity at the start time and completion time of the data evacuation performed by the information processor 100. The battery residual quantity recording process is called so as to be executed at each execution start time of the data evacuation by the information processor 100, upon decrease in the battery residual quantity, upon user operation of an instruction for suspension, or upon setting of energy saving (when no operation is performed for a predetermined period of time). As described, the battery residual quantity recording process is performed not only due to the decrease in the battery residual quantity but also due to the user instruction for suspension and setting of energy saving for suspension. The reason for this is to increase a chance to acquire the battery residual quantity used for data evacuation because data evacuation is also performed in such cases. Explanations will now be made to the battery residual quantity recording process.

[Step S11]

The OS 130t (see FIG. 4) of the information processor 100 informs the application 130u (see FIG. 4) operating thereon and any other necessary application(s) performing a transition process into a suspending state.

[Step S12]

The application 130u acquires the configurations of the internal device of the information processor 100 and the externally connected device at the point of time.

[Step S13]

The application 130u informs the battery residual quantity recorder 130r (see FIG. 4) of the start of data evacuation.

[Step S14]

The battery residual quantity recorder 130r records the battery residual quantity at the start time of data evacuation in the evacuation-time residual quantity table 121a (see FIG. 5) stored in the set information storage unit 120, based on the device configuration acquired in Step S12.

[Step S15]

The application 130u determines whether the data evacuation has been completed. If the data evacuation has been completed, the application 130u advances the process to Step S16. On the contrary, if the data evacuation has not been completed, the application 130u repeats the processing of step S15.

[Step S16]

The battery residual quantity recorder 130r records the battery residual quantity at the completion time of data evacuation in the evacuation-time residual quantity table 121a stored in the set information storage unit 120. After that, the process is completed. Upon completion of the battery residual quantity recording process, the information processor 100 completely transits to the suspending state (S4).

Explanations will now be made to an evacuation residual quantity setting process for setting the evacuation residual quantity based on the battery residual quantity before and after the last data evacuation.

Figure 8:
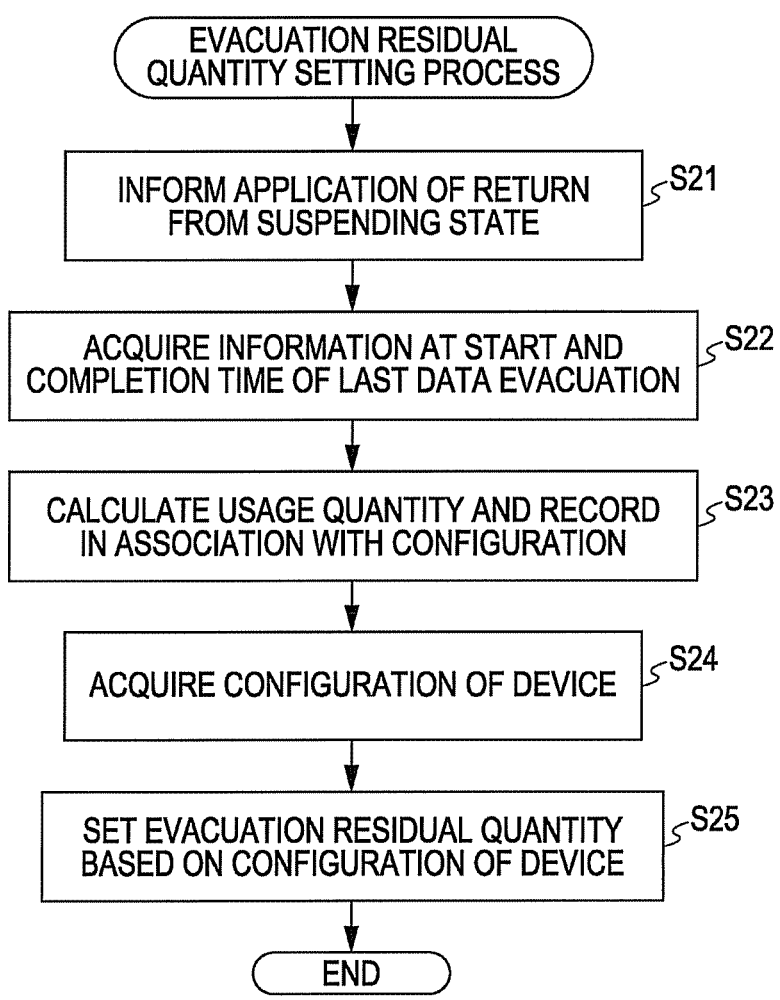
FIG. 8 is a flowchart showing a procedure in an evacuation residual quantity setting process.

FIG. 8 is a flowchart showing a procedure in the evacuation residual quantity setting process.

The information processor 100 of this embodiment newly sets an evacuation residual quantity through this evacuation residual quantity setting process, based on the battery residual quantities (recorded at the last data evacuation) before and after the data evacuation. This evacuation residual quantity setting process is called so as to be executed at the time the information processor 100 returns from the suspending state. Explanations will now be made to an evacuation residual quantity setting updating process.

[Step S21]

The OS 130t (see FIG. 4) of the information processor 100 informs the application 130u (see FIG. 4) operating on the OS 130t and any other necessary application(s), of the returning from the suspending state.

[Step S22]

The information processor 100 refers to the evacuation-time residual quantity table 121a (see FIG. 5) stored in the set information storage unit 120 (see FIG. 3), and acquires the battery residual quantity at the start time and completion time of the last data evacuation and the device configuration at the time of last data evacuation.

[Step S23]

The application 130u calculates the usage quantity of electric power at the last data evacuation based on the battery residual quantity (acquired in Step S22) at the start time and completion time of the last data evacuation. In addition, the application 130u recalculates the evacuation usage quantity information recorded in the evacuation usage quantity table 122a (see FIG. 6), based on the device configuration (acquired in Step S22) at the time of last data evacuation, and records the recalculation result in the evacuation usage quantity table 122a.

[Step S24]

The application 130u acquires the configurations of the internal devices of the information processor 100 and the externally connected device at that point in time.

[Step S25]

The application 130u sets the evacuation residual quantity based on the configuration of the device that is acquired in Step S24. After that, the process is completed. The battery residual quantity is determined based on thus set evacuation residual quantity, and will be a criterion for data evacuation (transition to a suspending state).

Explanations will now be made to a configuration monitoring process for monitoring a change in the configuration of a device of the information processor 100, and for setting an evacuation residual quantity in accordance with a changed configuration when the configuration of the device has been changed.

Figure 9:
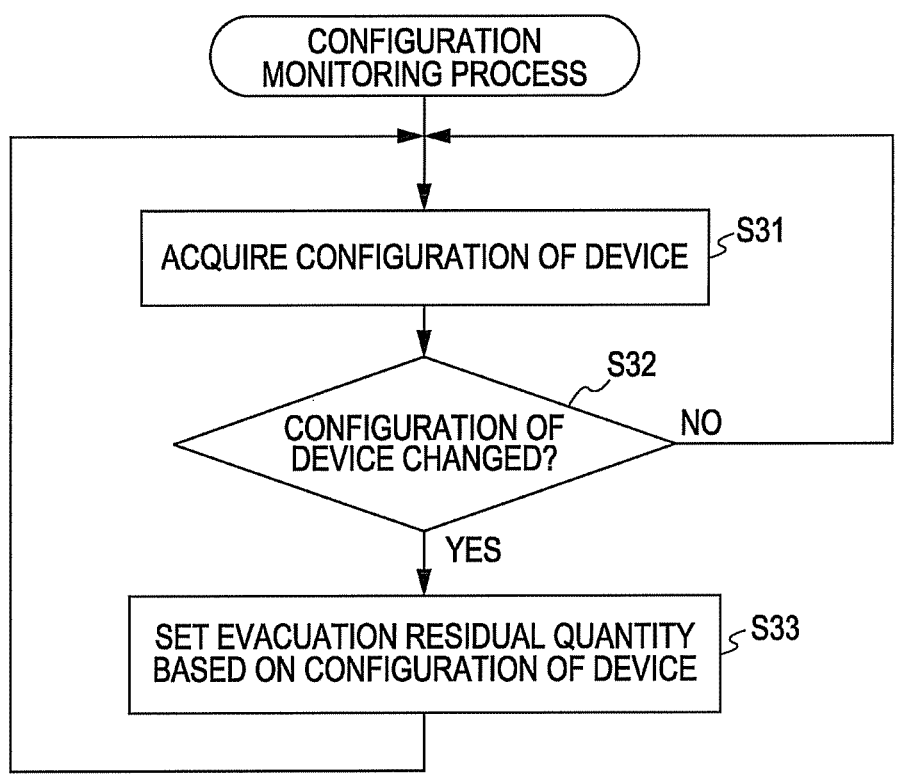
FIG. 9 is a flowchart showing a procedure in a configuration monitoring process.

FIG. 9 is a flowchart showing a procedure of the configuration monitoring process.

When the configuration of the device in the information processor 100 has been changed, the quantity of electric power consumed at general data evacuation will change. Thus, the setting of the evacuation residual quantity should be changed for the sake of safety.

The information processor 100 of this embodiment monitors a change in the configuration of an internal device and an externally connected device that are electric loads of the information processor 100, based on the configuration monitoring process. When the configuration of the device is changed, the evacuation residual quantity is set in accordance with the changed configuration. This evacuation residual quantity setting process is called so as to be executed always or at a predetermined interval in the information processor 100. Explanations will now be made to the configuration monitoring process.

[Step S31]

The application 130u (see FIG. 4) acquires the configuration of the internal device and externally connected device of the information processor 100, at that point of time.

[Step S32]

The application 130u compares the configuration of the device that is acquired in Step S31 with the previously acquired configuration of the device, so as to determine whether the configuration of the information processor 100 has been changed. If the configuration of the device has been changed, the application 130u advances the process to Step S33. On the contrary, if the configuration of the device has not been changed, the application 130u advances the process to Step S31.

[Step S33]

The application 130u sets the evacuation residual quantity based on the device configuration that is acquired in step S31. Specifically, the application 130u selects an average value corresponding to a configuration pattern of the device configuration acquired in Step S31, from the evacuation usage quantity table 122a (see FIG. 6), and sets the selected average value as an evacuation residual quantity. At this time, a margin may be added to the selected average value so as to set the evacuation residual quantity, based on the selected average value, without using the value as is.

The change in the device configuration is detected by the configuration detecting unit 112a (see FIG. 3) using the Plug and Play function as described above. When the change in the device configuration has been detected, the setting of the evacuation residual quantity will be changed. In this embodiment, calculation is tried again from the beginning at each change. However, it is not limited to this. A margin may be set in advance and only the set margin may be changed at each change.

A plurality of evacuation residual quantities may be prepared in accordance with the configuration pattern (see FIG. 5 and FIG. 6) of the device configuration. Particularly, in a portable information processor, the device configuration may frequently be added or deleted. Various configurations may be set, for example, at the usage of home, the usage of office, the usage of the destination of business trip and the like. In such examples, it is preferable that the evacuation residual quantity is kept in the configurations of the above three cases.

The electric power quantities of the respective devices may be computed, thereby calculating the evacuation residual quantities of the configuration of an unknown combination of devices. The difference in the electric power quantities of a single device may be calculated based on the difference and the like. In this case, the electric power quantity to be consumed at the time of evacuating data for the single device is recorded so as to manage the electric power quantity in detail.

The operational environment of the information processor 100 (whether the temperature or installation is stable) may be reflected in the evacuation residual quantity. For example, it is considered that a cooling fan needs to operate with electric power, if a room temperature is high. If the information processor 100 is installed in a stable place, the hard disc is stably operated. However, if it is installed in an unstable place, an error may possibly occur so as to increase the processing time. A margin of the evacuation residual quantity may further be changed in accordance with the above conditions. As a result, it is possible to correspond to a change of the time and electric power quantity required for data evacuation in accordance with the operational environment.

The setting may be changed (e.g. increasing the margin) in response to an operator instruction. Accordingly, even when the evacuation residual quantity is difficult to accurately be calculated (for example, when a new application or device is added), a large margin may be maintained for the sake of safety.

Explanations will now be made to a setting page that is displayed on a display page of the information processor of this embodiment. The setting page is displayed on the display page of the monitor 200, and is a display page for setting a configuration pattern representing the above-described device configuration.

Figure 10:
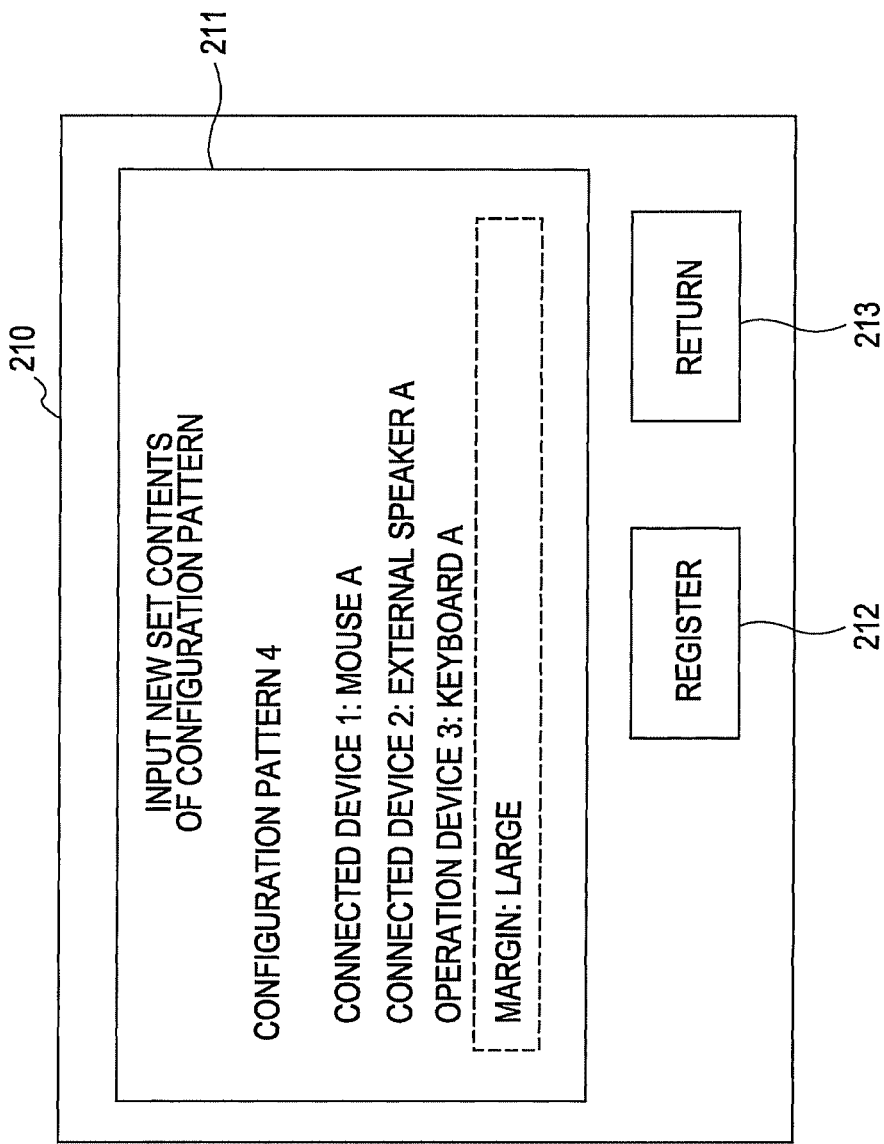
FIG. 10 is a diagram showing a setting display page.

FIG. 10 is a diagram showing the setting page.

The setting page 210 includes a setting input area 211, a "register" button 212 and a "return" button 213.

The setting input area 211 accepts a user input regarding the setting contents of the configuration pattern. The setting input area 211 is to display a message requesting to input new setting contents for the configuration pattern. This setting input area 211 is provided so that the user can input new setting contents of the configuration pattern.

The "register" button 212 is a button for accepting a register input for registering an input of the configuration pattern to be newly set.

The "return" button 213 is a button for accepting a return input for canceling an input of the setting contents for the configuration pattern to be newly set.

For example, in the case of a high performance information processor, the consumption power in an SO state (normal operation) is very large. Thus, the data evacuation process may not be completed, unless the residual quantity is equal to or greater than a predetermined quantity (e.g. 10%). Even if low electric power is consumed in an SO state, an amount of data to be evacuated in the HDD increases in the information processor having large storage capacity. As a result, it is necessary to start the evacuation operation in a state of a relatively large battery residual quantity.

When the residual quantity is calculated at percent, a high electric power quantity is applied per residual quantity at %, if the capacity of the battery is large. Thus, a small value may be set depending on the residual quantity at the start of data evacuation. However, if the capacity of the battery is small, it is necessary to set a larger value.

It is necessary to consider the individual variations of the information processors. Because industrial products as the information processor may have some variations, it is necessary to appropriately set the chance to start the evacuation, reflecting the variations of the products.

According to the information processor 100 of this embodiment, the residual quantity of the battery used for the actual data evacuation is acquired, and the evacuation residual quantity for starting the data evacuation is determined based on the acquired information. Thus, when the residual quantity of the battery 130c is very small, the data stored in the RAM 102 can completely be evacuated, and a long working time of the information processor 100 can be attained eve under various conditions of the information processor 100.

Accordingly, the explanations have been made to the information processor of the present technique, the data evacuation program and the data evacuation method, based on the illustrated embodiment. The above explanations are to simply describe the principles of the present technique. The present technique is not limited to the above-described accurate configuration and application. It is obvious to those skilled in the art that various modifications and changes are possible. All corresponding modifications and equivalence are within the scope of the present technique in the attached claims and the equivalence, and the configuration of each unit may be replaced with an arbitrary configuration having the same function. Any other arbitrary configuration or process may be added to the present technique. The present technique may be formed with a combination of arbitrary two or more configurations (features) of the above-described embodiment.

The above-described processing functions may be realized by a computer. In this case, provided is a program describing the processing contents of the functions that the information processor 100 should have. Upon execution of this program by the computer, the above-described processing functions can be realized on the computer.

The program describing the processing contents can be recorded on a computer readable recording medium. Examples of the computer readable recording medium are a magnetic recording unit, an optical disc, a magneto-optical recording medium, a semiconductor memory and the like. Examples of the magnetic recording unit are HDD, an FD (flexible disk), an MT (magnetic tape) and the like. Examples of the optical disc are a DVD (Digital Versatile Disc), a DVD-RAM, a CD-ROM (Compact Disc-Read Only Memory), a CD-R (Recordable)/RW (ReWritable) and the like. An example of the magneto-optical recording medium is an MO (Magneto-Optical disk) and the like.

In the distribution of the above-described program, for example, a portable recording medium (e.g., a DVD, CD-ROM including the program recorded therein) is sold. The program is stored in a server computer, and the server computer may transfer the program to another computer through a network.

The computer executing the above program stores the program recorded in the portable recording medium or the program transferred from the server computer, in its own storage unit. The computer reads the program from its own storage unit so as to execute the process in accordance with the program. Note that the computer directly reads the program from the portable recording medium, thereby enabling to execute the process in accordance with the program. Every time the program is transferred from the server computer, the computer may sequentially execute the process in accordance with the received program.

According to the information processor, the data evacuation program and the data evacuation method of the present technique, when the battery residual quantity is very small, data can safely be evacuated, and a long working time of the information processor can be attained.

The many features and advantages of the embodiment(s) are apparent from the detailed specification and, thus, it is intended by the appended claims to cover all such features and advantages of the embodiment(s) that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. An information processor that is driven by a battery, comprising:
   a set information storage unit storing evacuation residual quantity information representing an evacuation residual quantity as a residual quantity of the battery that corresponds to electric power necessary for executing a data evacuation process for storing data, stored in a memory of the information processor, onto a nonvolatile recording medium;
   a battery residual quantity detecting unit detecting the battery residual quantity of the battery;
   a load information collecting unit acquiring load information representing an electric load of the information processor;
   an evacuation residual quantity setting unit setting the evacuation residual quantity based on the load information collected by the load information collecting unit and based on a difference between a battery residual power that was detected by the battery residual quantity detecting unit at a beginning of a prior data evacuation process and a battery residual power that was detected by the battery residual quantity detecting unit at a completion of the prior data evacuation process, the evacuation residual quantity setting unit controlling the set information storage unit to store the evacuation residual quantity information representing the set evacuation residual quantity; and
   an evacuation control unit controlling execution of the data evacuation process based on the battery residual quantity detected by the battery residual quantity detecting unit and the evacuation residual quantity information stored in the set information storage unit, wherein
   the evacuation control unit executes the data evacuation process when the battery residual quantity detected by the battery residual quantity detecting unit is less than or equal to the evacuation residual quantity set by the evacuation residual quantity setting unit.

2. The information processor according to claim 1, further comprising:
a temperature detecting unit detecting a temperature of the battery; and
a temperature correcting unit correcting the evacuation residual quantity information based on the temperature of the battery that is detected by the temperature detecting unit,
wherein the evacuation residual quantity setting unit corrects the set evacuation residual quantity based on the temperature of the battery that is detected by the temperature detecting unit and stores the evacuation residual quantity information representing the corrected evacuation residual quantity in the set information storage unit.

3. The information processor according to claim 1, wherein
the load information collecting means includes a configuration detecting unit detecting a configuration of a device that exerts an electric load on the information processor,
the electric load represented in the load information includes configuration information representing the configuration of the device that is detected by the configuration detecting unit,
the evacuation residual quantity information includes a plurality of information items according to the configuration of the device, and
the evacuation control unit controls execution of the data evacuation process, based on the battery residual quantity detected by the battery residual quantity detecting unit and the evacuation residual quantity information stored in the set information storage unit, in accordance with the configuration of the device that is represented in the configuration information.

4. The information processor according to claim 3, wherein
the evacuation residual quantity setting unit sets the evacuation residual quantity in accordance with a change in the configuration of the device, when the configuration of the device that is detected by the configuration detecting unit and represented in the configuration information has been changed, and stores the evacuation residual quantity information representing the set evacuation residual quantity in the set information storage unit.

5. The information processor according to claim 1, further comprising:
a stand-by transition unit transiting the information processor into a stand-by state for stopping a part of an operation of the information processor while keeping the data in the memory, when a predetermined condition has been satisfied,
wherein the battery residual quantity detecting unit detects the battery residual quantity in the stand-by state, and
the evacuation control unit controls execution of the data evacuation process, based on the battery residual quantity detected by the battery residual quantity detecting unit and the evacuation residual quantity information stored in the set information storage unit, in the stand-by state that the stand-by transition unit has transited.

6. A computer readable recording medium which records a data evacuation program for controlling a computer to execute a data evacuation process for evacuating data stored in a memory of an information processor that is driven by a battery, the recording medium controlling the computer to function as:

a load information collecting unit acquiring load information representing an electric load of the information processor;
a battery residual quantity detecting unit detecting the battery residual quantity of the battery;
an evacuation residual quantity setting unit setting an evacuation residual quantity as a residual quantity of the battery that corresponds to electric power necessary for executing a data evacuation process for storing the data, on a nonvolatile recording medium, which is stored in the memory of the information processor, based on the load information collected by the load information collecting unit, and based on a difference between a battery residual power that was detected by the battery residual quantity detecting unit at a beginning of a prior data evacuation process and a battery residual power that was detected by the battery residual quantity detecting unit at a completion of the prior data evacuation process, and storing evacuation residual quantity information representing the set evacuation residual quantity in a set information storage unit; and
an evacuation control unit controlling execution of the data evacuation process based on the battery residual quantity detected by the battery residual quantity detecting unit and the evacuation residual quantity information stored in the set information storage unit, wherein
the evacuation control unit executes the data evacuation process when the battery residual quantity detected by the battery residual quantity detecting unit is less than or equal to the evacuation residual quantity set by the evacuation residual quantity setting unit.

7. A data evacuation method for a computer to evacuate data stored in a memory of an information processor that is driven by a battery, the method comprising:
detecting a battery residual quantity of the battery, by a battery residual quantity detecting unit;
acquiring load information representing an electric load of the information processor, by a load information collecting unit;
setting an evacuation residual quantity as a residual quantity of the battery that corresponds to electric power necessary for executing a data evacuation process for storing the data stored in the memory of the information processor on a nonvolatile recording medium, based on the load information collected by the load information collecting unit and based on a difference between a battery residual power that was detected at a beginning of a prior data evacuation process and a battery residual power that was detected at a completion of the prior data evacuation process, and storing evacuation residual quantity information representing the set evacuation residual quantity in a set information storage unit, by an evacuation residual quantity setting unit; and
controlling execution of the data evacuation process based on the battery residual quantity detected by the battery residual quantity detecting unit and the evacuation residual quantity information stored in the set information storage unit, by an evacuation control unit, wherein
the data evacuation process is executed when the detected battery residual quantity is less than or equal to the set evacuation residual quantity.

* * * * *

UNITED STATES PATENT AND TRADEMARK OFFICE
CERTIFICATE OF CORRECTION

PATENT NO. : 8,429,430 B2
APPLICATION NO. : 12/366992
DATED : April 23, 2013
INVENTOR(S) : Nobuyuki Koike It is certified that error appears in the above-identified patent and that said Letters Patent is hereby corrected as shown below:

In the Claims:

Column 18, Line 14 (Approx.), In Claim 6, delete "unit, and" and insert -- unit and --, therefor.

Signed and Sealed this
Thirteenth Day of August, 2013

Teresa Stanek Rea
*Acting Director of the United States Patent and Trademark Office*